United States Patent
Scuteri et al.

(10) Patent No.: US 7,471,148 B2
(45) Date of Patent: Dec. 30, 2008

(54) DIFFERENTIAL LOW NOISE AMPLIFIER (LNA) WITH COMMON MODE FEEDBACK AND GAIN CONTROL

(75) Inventors: Jeremy Scuteri, Highland, NY (US); Gregory Blum, Lagrangeville, NY (US)

(73) Assignee: Sekio Epson Corporation, Tokyo (JP)

( * ) Notice: Subject to any disclaimer, the term of this patent is extended or adjusted under 35 U.S.C. 154(b) by 15 days.

(21) Appl. No.: 11/751,491

(22) Filed: May 21, 2007

(65) Prior Publication Data

US 2008/0290940 A1 Nov. 27, 2008

(51) Int. Cl.
*H03F 3/45* (2006.01)
(52) U.S. Cl. .................................. 330/253; 330/258
(58) Field of Classification Search ................. 330/253, 330/254, 258, 260; 327/359, 563
See application file for complete search history.

(56) References Cited

U.S. PATENT DOCUMENTS

| | | | |
|---|---|---|---|
| 5,281,924 A * | 1/1994 | Maloberti et al. ........... | 330/253 |
| 6,316,970 B1 | 11/2001 | Hebert | |
| 6,590,980 B1 | 7/2003 | Moraveji | |
| 6,624,698 B2 | 9/2003 | Nagaraj | |
| 6,677,822 B2 * | 1/2004 | Hasegawa .................... | 330/253 |
| 6,714,079 B2 | 3/2004 | Dessard et al. | |
| 6,727,757 B1 | 4/2004 | Venkatraman et al. | |
| 6,954,170 B2 | 10/2005 | Leung | |
| 7,053,711 B2 | 5/2006 | Bogner | |
| 7,295,070 B2 * | 11/2007 | Dillon ........................ | 330/258 |
| 2007/0109051 A1 * | 5/2007 | Sutardja ..................... | 330/258 |

* cited by examiner

*Primary Examiner*—Khanh V Nguyen (57) ABSTRACT

A method, algorithm, architecture, circuits, and/or systems for low noise amplification are disclosed. In one embodiment, an amplifier can include an input stage, including a first differential input configured to receive a differential signal, a first current source coupled to the first differential input, a first current load receiving a first bias voltage and coupling the input stage to a first power supply, and a first pair of common mode feedback transistors, coupled to an output of the first current load and configured to limit a current to the first current source. The input stage provides an amplified signal to an additional stage having a structure similar to the input stage, configured to further amplify the amplified signal.

24 Claims, 7 Drawing Sheets

DIFFERENTIAL LOW NOISE AMPLIFIER (LNA) WITH COMMON MODE FEEDBACK AND GAIN CONTROL

FIELD OF THE INVENTION

The present invention generally relates to the field of amplifier circuits. More specifically, embodiments of the present invention pertain to methods, circuits, and/or systems for differential low noise amplification with common mode feedback and gain control.

DISCUSSION OF THE BACKGROUND

In many amplifier circuits, low noise performance generally is achieved by using relatively large resistors, and a separate error amplifier for common mode feedback. However, large resistors tend to result in relatively large area consumption. Also, a separate error amplifier can result in increased power consumption.

Another conventional solution involves DC coupled amplifiers. However, only one or two amplification stages are typically utilized in such an approach because of DC offset buildup. Other conventional solutions utilize ratios of resistors to set gain in a simple feedback scheme. However, these solutions may not easily lend themselves to changing the gain of the amplifier. Thus, a reliable and simplified low noise amplification approach that minimizes power consumption, operates over relatively large supply voltage range, and has an easily adjustable gain would be advantageous.

SUMMARY OF THE INVENTION

Embodiments of the present invention relate to methods, algorithms, architectures, circuits, and/or systems for low noise amplification (LNA).

In one embodiment, an amplifier can include: (a) an input stage, including (i) a first pair of input transistors configured to receive a differential signal, (ii) a first current source transistor coupled to the first pair of input transistors, (iii) a first pair of current load transistors receiving a first bias voltage and coupling the input stage to a first power supply, and (iv) a first pair of common mode feedback transistors, coupled to an output of the first pair of current load transistors and configured to limit a current to the first current source transistor, the input stage providing an amplified signal; (b) an additional stage, including (i) a second pair of input transistors configured to receive the amplified signal from the input stage, (ii) a second current source transistor coupled to the second pair of input transistors, (iii) a second pair of current load transistors receiving the first bias voltage and coupling the additional stage to the first power supply, and (iv) a second pair of common mode feedback transistors, coupled to an output of the second pair of current load transistors and configured to limit a current to the second current source transistor, the additional stage providing an amplified output; (c) a first bias circuit configured to provide the first bias voltage to the first and second pairs of current load transistors; and (d) one or more second bias circuits configured to bias the first and second current source transistors.

In another embodiment, a method of controlling a gain in an LNA can include the steps of: (a) receiving a differential signal in an input stage, where the input stage can include (i) a first current source coupled to a differential input of the input stage, (ii) a first current load receiving a first bias voltage and coupling the input stage to a first power supply, and (iii) a first pair of common mode feedback transistors, coupled to an output of the first current load and configured to limit a current to the first current source, where the input stage provides an amplified signal; (b) receiving the amplified signal from the input stage in an additional stage, where the additional stage can include (i) a second current source coupled to a differential input of the additional stage, (ii) a second current load receiving the first bias voltage and coupling the additional stage to the first power supply, and (iii) a second pair of common mode feedback transistors, coupled to an output of the second current load and configured to limit a current to the second current source, where the additional stage provides an amplified output; (c) providing the first bias voltage to the first and second current loads; and (d) biasing the first and second current sources.

Embodiments of the present invention can advantageously provide a reliable and simplified low noise amplification approach that does not suffer from increased power consumption due to an error amplifier. Further, embodiments of the present invention can operate over a relatively large supply voltage range, and also include a relatively easily adjustable gain. These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "line" and "signal" refer to any known structure, construction, arrangement, technique, method and/or process for physically transferring electrical, optical or waveform-based information from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with," (which may refer to direct or indirect connections, couplings, or communications) but these terms are generally given their art-recognized meanings herein.

Embodiments of the present invention relate to methods, algorithms, architectures, circuits, and/or systems for low noise amplification. Another aspect of the invention relates to a method of controlling a gain in an LNA. The invention further relates to hardware implementations of the present architecture, method and circuit. Embodiments of the present invention can advantageously provide a reliable and simplified low noise amplification approach that does not suffer from increased power consumption due to an error amplifier. Further, embodiments of the present invention can operate over a relatively large supply voltage range, and also include a relatively easily adjustable gain. The invention, in its various aspects, will be explained in greater detail below with regard to exemplary embodiments.

According to various embodiments of the present invention, an architecture and/or circuit for a low noise amplifier (LNA) with gain control can include three stages to achieve a desired gain. Of course, stages may be added (e.g., more than three stages total) or removed (e.g., less than three stages total) to increase/decrease a maximum amplifier gain. In any event, all included stages may utilize the same or a similar topology in order to simplify design, and to allow all stages to share a single biasing network. This approach can result in reduced power consumption, as compared to conventional approaches.

A target application for the particular example circuitry shown herein is an amplitude modulated (AM) radio receiver, with emphasis on low power consumption and sensitivity. For example, an amplifier in particular embodiments may include a variable gain that can be set by an automatic gain control (AGC) scheme. In one application, the LNA can receive signals as small as 0.3 µVrms, with frequencies ranging from 40 kHz to 77.5 kHz. Generally, LNA gain may be frequency- and reference current-dependent, such that as the frequency increases, the gain decreases (and vice versa), and as the current increases, the gain increases (and vice versa). Also, the target gain of the LNA for one implementation in this application was approximately 66,000V/V, although it may be from about 20,000V/V to about 100,000V/V in other applications. In addition, the target gain per stage in this application may range from about 200V/V to about 400V/V for a given reference current, at a bandwidth of about 20 kHz. Of course, other gains (both per stage and for the amplifier as a whole) and bandwidths can occur in other applications and/or when using other reference currents.

An Exemplary Low Noise Amplifier (LNA) Circuit

An exemplary LNA circuit can include: (a) an input stage, including (i) a first pair of input transistors configured to receive a differential signal, (ii) a first current source transistor coupled to the first pair of input transistors, (iii) a first pair of current load transistors receiving a first bias voltage and coupling the input stage to a first power supply, and (iv) a first pair of common mode feedback transistors, coupled to an output of the first pair of current load transistors and configured to limit a current to the first current source transistor, the input stage providing an amplified signal; (b) an additional stage, including (i) a second pair of input transistors configured to receive the amplified signal from the input stage, (ii) a second current source transistor coupled to the second pair of input transistors, (iii) a second pair of current load transistors receiving the first bias voltage and coupling the additional stage to the first power supply, and (iv) a second pair of common mode feedback transistors, coupled to an output of the second pair of current load transistors and configured to limit a current to the second current source transistor, the additional stage providing an amplified output; (c) a first bias circuit configured to provide the first bias voltage to the first and second pairs of current load transistors; and (d) one or more second bias circuits configured to bias the first and second current source transistors.

Figure 1:
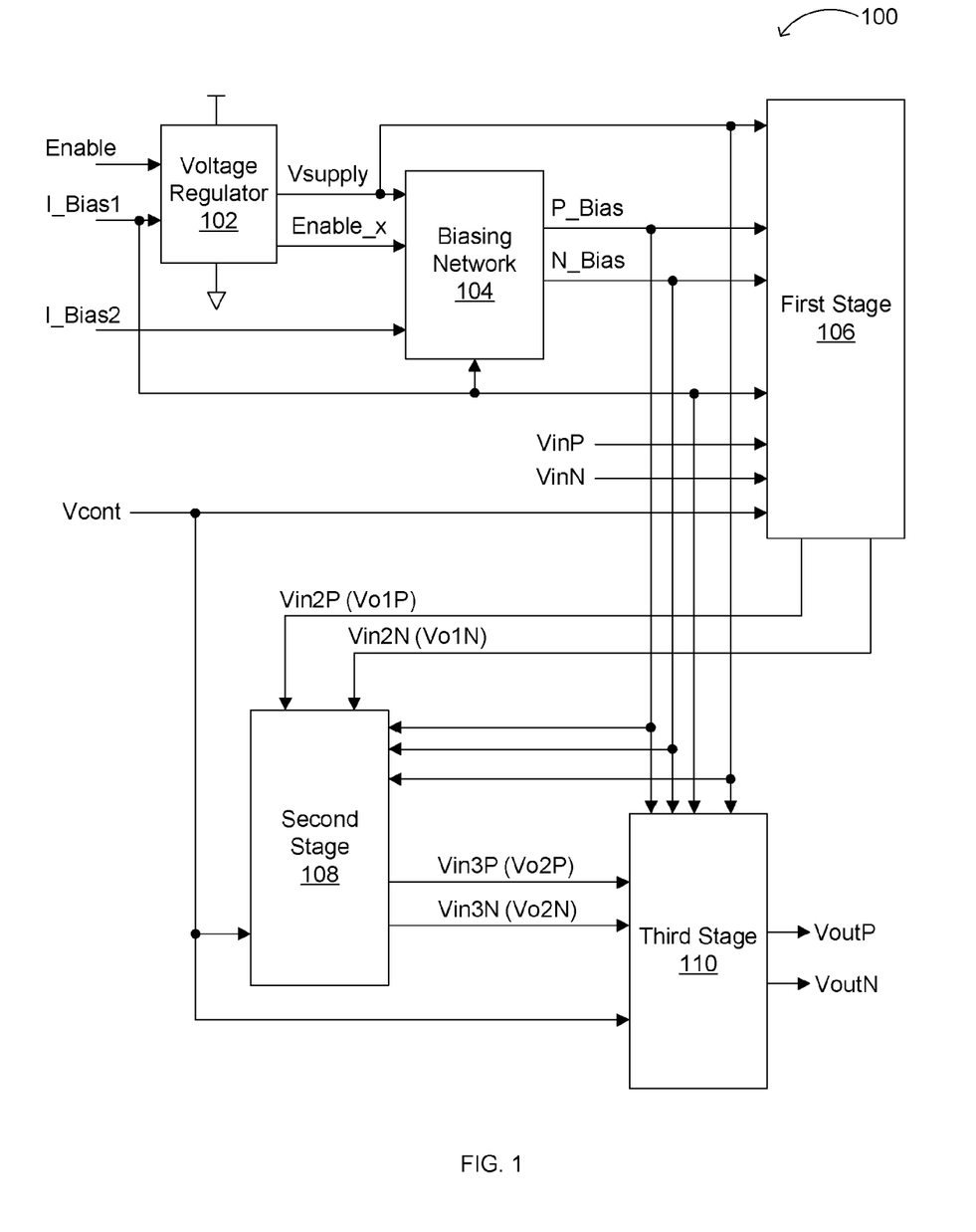
FIG. 1 is an exemplary schematic block diagram showing a low noise amplifier (LNA) in accordance with embodiments of the present invention.

FIG. 1 shows an exemplary schematic block diagram for a low noise amplifier (LNA) 100 in accordance with embodiments of the present invention. The LNA 100 can include bias or "reference" current inputs, I_Bias1 and I_Bias2. In one implementation, reference current inputs I_Bias1 and I_Bias2 each have the same value (e.g., about 100 nA), but they may have different values, depending on design choices and objectives. I_Bias1 can be provided to voltage regulator 102, biasing network 104, first stage 106, and third stage 110. I_Bias2 can also be provided to biasing network 104. In addition, VDD and GND supply power to the circuit, as shown for voltage regulator 102.

Main bias current I_Bias1 can be used to bias NMOS current source loads (e.g., via N_Bias), NMOS pull-down transistors, and PMOS current sources (e.g., via P_Bias) in each amplifier stage (e.g., first stage 106, second stage 108, and third stage 110). Current bias I_Bias2 may be used to generate a reference voltage to set the common mode of the first stage output (e.g., differential signal Vo1P (positive) and Vo1N (negative)). First stage 106 differential output Vo1P and Vo1N can also serve as inputs to second stage 108 (e.g., Vin2P and Vin2N, respectively). Similarly, second stage 108 differential output Vo2P and Vo2N can then serve as inputs to third stage 110 (e.g., Vin3P and Vin3N, respectively). Also, gain control input Vcont may be used to set a desired gain/attenuation in the first, second, and third stages. The third stage output may be a differential signal (e.g., VoutP/VoutN). Further, an enable signal (e.g., the input Enable to voltage regulator 102 and/or the input Enable_x to bias network 104) may be utilized to turn the LNA off to reduce or prevent power consumption when not in operation.

Figure 2:
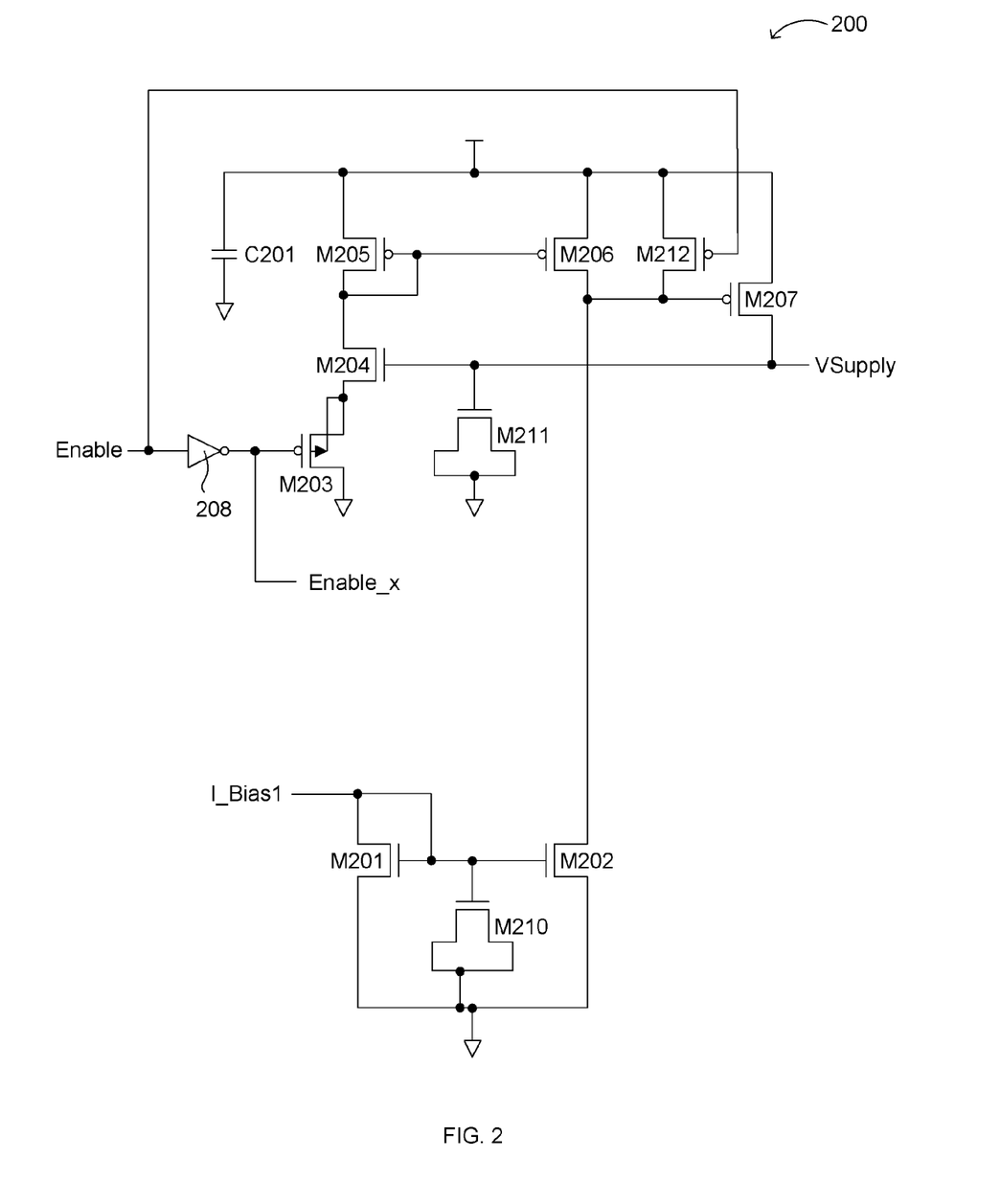
FIG. 2 is an exemplary schematic diagram showing a voltage regulator for LNA supply in accordance with embodiments of the present invention.

FIG. 2 shows an exemplary schematic diagram for a voltage regulator 200 configured to provide a regulated and/or substantially constant supply voltage to an amplifier (e.g., LNA 100 in FIG. 1) in accordance with embodiments of the present invention. Voltage regulator 200 can extend a voltage range over which the LNA can operate, and relatively large supply ranges can thus be tolerated. For example, such a design may generally operate from about VDD=1.2V to about VDD=5V, but lower or higher supply voltages can also be accommodated in particular embodiments.

In operation, an I_Bias1 current of about 100 nA can flow through NMOS transistor M201, and be mirrored to NMOS transistor M202. Accordingly, a current of about 100 nA can be pulled out of PMOS transistor M206. The enable signal (e.g., Enable) can pass via inverter 208, and provide signal Enable_x to the gate of PMOS transistor M203, thus turning transistor M203 on during normal operation (e.g., when Enable=VDD, and Enable_x=GND). The gate of NMOS transistor M204 may be set by negative feedback to a voltage level for 100 nA to flow through transistors M203, M204, and M205.

In this fashion, VSupply may have a maximum value of the gate to source voltage (Vgs) of transistor M203 plus the Vgs of transistor M204. When VDD is low, transistors M203, M204, and M205 may not be able to support a 100 nA bias current. In this event, the gate of PMOS transistor M207 may be pulled to ground, and VSupply may be charged to VDD. Thus, PMOS transistor M207 can be sized so as to supply the current required by the LNA with a minimal voltage drop when the gate of transistor M207 is near GND. This design can allow VDD to have a relatively large range, but VSupply may be limited to a maximum of about Vgs (M203)+Vgs (M204), as discussed above.

The regulator of FIG. 2 also includes stabilizing capacitors (e.g., capacitor configured transistors M210 and M211), and additional supply capacitance C201. M211 can help to stabilize the voltage supply node, VSupply, while M210 can help to stabilize the gates of NMOS transistors M201 and M202 that received bias current I_Bias1. Further, PMOS transistor M212 can be used to turn off PMOS transistor M207 when the enable signal is low by pulling up the gate of M207.

Figure 3:
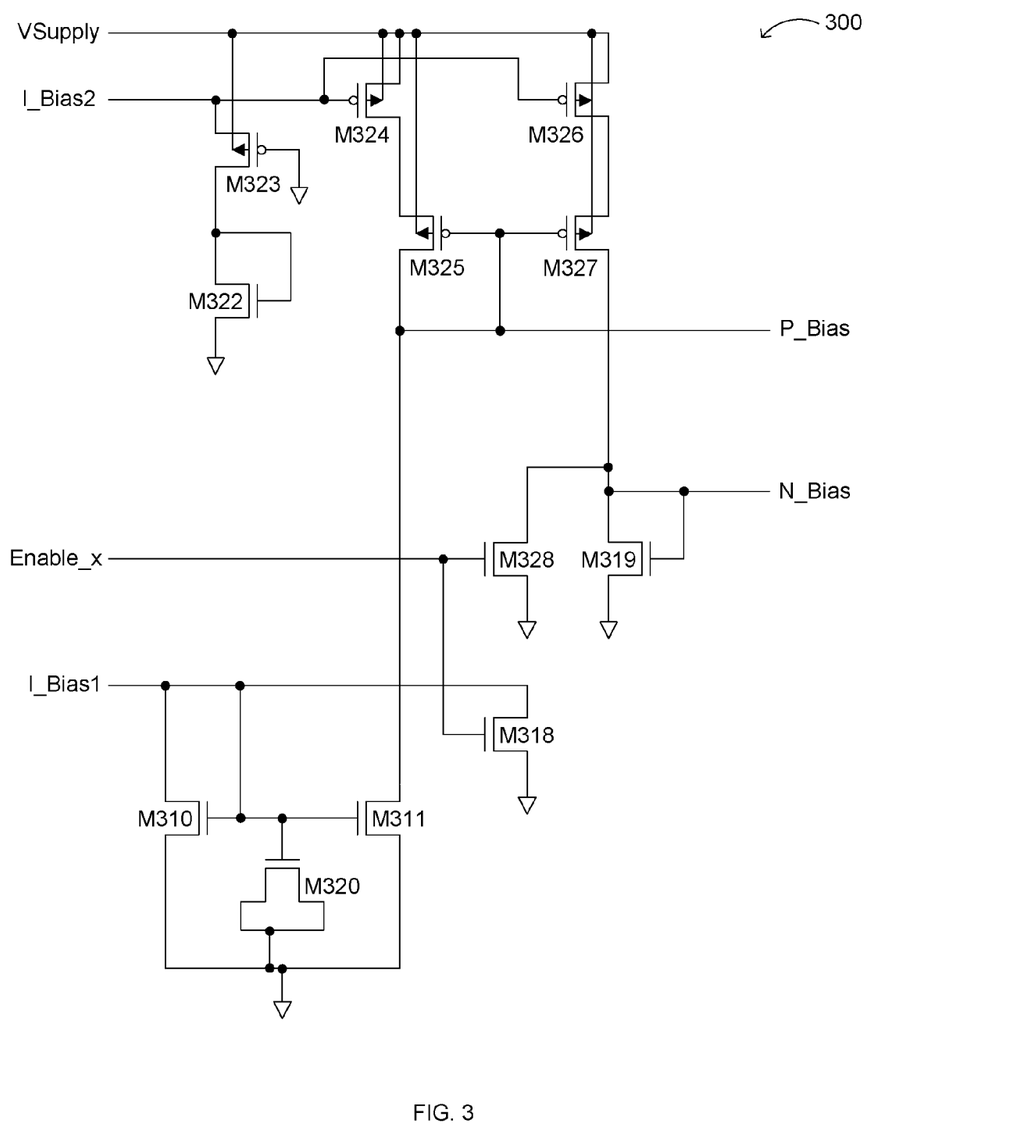
FIG. 3 is an exemplary schematic diagram showing a biasing network for an LNA in accordance with embodiments of the present invention.

FIG. 3 shows an exemplary schematic diagram for a biasing network 300 configured to provide bias signals to an amplifier (e.g., LNA 100 in FIG. 1) in accordance with embodiments of the present invention. In general, one bias voltage (e.g., P_Bias) may be used as a PMOS transistor current source (e.g., providing "head" or "tail" current, depending on the particular circuit configuration used) to set an amount of current flowing through the stage, and another bias voltage (e.g., N_Bias) may be used for NMOS transistor current source loads. In addition, transistor layouts can be configured as multi-fingered devices in order to create more accurate transistor size ratios for increased accuracy in current mirrors, and to reduce device capacitance that may decrease a circuit bandwidth for a given current consumption.

I_Bias1 may be a 100 nA bias current input used to bias all three stages of the LNA. This 100 nA may be pushed into NMOS transistor M310, which can cause 500 nA to be mirrored into NMOS transistor M311 depending on the relative sizes of M310 and M311, which can pull 500 nA from PMOS transistors M324 and M325. This 500 nA current flowing through PMOS transistor M325 may be mirrored to transistor M327, causing 500 nA to be pushed into NMOS transistor M319. Accordingly, PMOS transistor M325 may be a current mirror that biases PMOS transistor currents for each stage, and transistor M319 may be the current mirror that biases all the NMOS current source loads. A relatively simple multi-fingering ratio can set the current for each stage of the LNA.

NMOS transistors M318 and M328 may be used to turn the LNA off, and reduce or prevent power consumption, when the circuit is not being used (e.g., enable is low). This method of disabling the LNA may also necessitate the 100 nA bias current (I_Bias1) being disabled from the bias generator to prevent a short from I_Bias1 to ground when transistor M318 is turned on. NMOS transistor M320 is a simple NMOS capacitor used to suppress any AC content on the DC bias lines. Since a differential structure is used, most of this would be common mode information, which can be rejected by the circuit, but an inherent mismatch between devices may not allow for perfect common mode rejection. Further, I_Bias2 may also be a bias current input of approximately 100 nA, which can create a voltage reference for setting the common mode of the output of each stage by pushing a current into PMOS transistor M323 and diode-connected NMOS transistor M322. Of course, other suitable I_Bias1 and I_Bias2 values, as well as relative transistor sizes for current mirroring can also be utilized in particular embodiments. For example, I_Bias2 may be replaced in some embodiments by a reference voltage, and transistors M322 and M323 can be removed in such a case.

Figure 4:
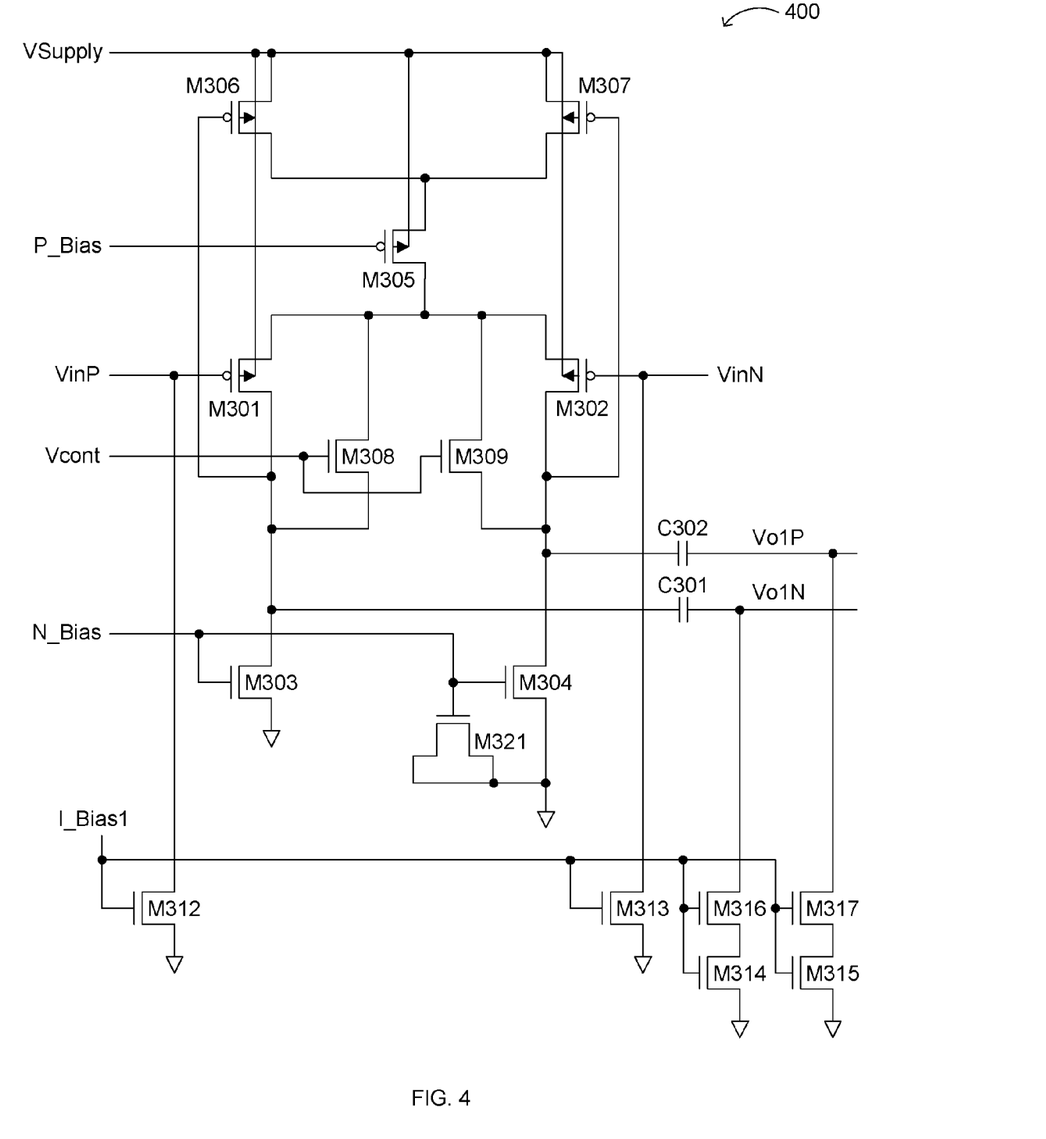
FIG. 4 is an exemplary schematic diagram showing exemplary first stage circuitry for an LNA in accordance with embodiments of the present invention.

FIG. 4 shows an exemplary schematic diagram for first stage circuitry 400 for an amplifier (e.g., LNA 100 in FIG. 1) in accordance with embodiments of the present invention. A differential input is formed by PMOS transistors M301 and M302. PMOS transistors may be preferred for their slightly better noise performance, as compared to NMOS transistors. Transistors M301 and M302 may be relatively large in order to reduce "flicker" or "1/f" noise, which is inherent in transistors. This is a frequency dependent, inherent noise source in all transistors that is proportional to the inverse of the signal frequency (i.e., there is more flicker noise at low frequencies than at high frequencies), and it can be a major noise contributor in the kHz frequency range.

The first stage may also consume more power than the second and third stages for noise performance reasons. In particular, higher current in the first stage may help reduce drain current noise, which differs from "flicker" noise in the sense that it is not frequency dependent, and it is reduced by increasing the current density in a given transistor. In one embodiment, the input transistors of the first stage are sized so that "flicker" noise is reduced to a tolerable level, then the amount of current flowing through the first stage is increased, thereby increasing the current density of the input pair transistors sufficiently to reduce drain current noise to an acceptable level. (In the context of this application, the terms "tolerable level" and/or "acceptable level" may refer to a level where the probability of signal processing errors caused by such noise is below a predetermined and/or commercially acceptable threshold.) This drain current noise may also influence the sizing of the transistors in the biasing network and current source loads so that proper current densities are achieved. It is desirable for noise in the first stage to be minimized because the first stage noise performance can affect the input-referred noise of the entire LNA. For example, in one implementation, the first stage may consume about 12 µA, while the second and third stages combined may only consume about 6 µA. Further, both low voltage (e.g., 1.2V) and higher voltage (e.g., 5V) applications can also be accommodated in particular embodiments, the higher voltages in this range working effectively in conjunction with a regulator (e.g., voltage regulator 200 of FIG. 2). In some embodiments, the lower voltage applications may not require the voltage regulator, while the higher voltage applications typically will utilize the voltage regulator.

PMOS transistors M306 and M307 can provide the common mode feedback to set the DC levels of the high impedance output (e.g., the node where M301 connects to M303 and where M302 connects to M304) of the first stage. The DC levels of Vo1P/Vo1N are set to near ground by pull down transistors M314 through M317. For correct operation, transistors M306 and M307 may be biased in the triode region. These devices can act as source degeneration by providing a voltage drop at the source of PMOS transistor M305, which may provide current for the first stage. In this fashion, the current being pushed into the first stage by transistor M305 can match the sum of the current source loads of NMOS transistors M303 and M304. If there was no common mode feedback and the current from transistor M305 did not match the sum currents of transistors M306 and M307, then the DC levels of the output (e.g., the node where M301 connects to M303 and where M302 connects to M304) would consequently not be well defined, and either the current source loads or the differential pair could be pushed into the triode region, thereby causing their output impedances to drop, and also their respective gains.

Because PMOS transistors M325 and M327 (see FIG. 3) have transistors for source degeneration, PMOS transistor M305 can mirror the current from transistor M325 by transistors M306 and M307 providing the same relative amount of source degeneration. This causes the common mode voltage of the gates of transistors M306 and M307 to be at the common mode reference voltage setup by I_Bias2. Transistors M306 and M307 may act as two resistors in parallel to sense the common mode voltage of the output. When a differential signal is present, one resistance goes up and the other goes down, thus maintaining an approximately constant resistance to degenerate device M305 to balance the current source loads (e.g., M303 and M304).

NMOS transistors M312 and M313 may be 100 nA current sources that bias the inputs of the LNA at ground. This can allow a differential or single-ended antenna to be used. For example, to accommodate single-ended signaling, one input (e.g., VinP or VinN) of the first stage can be fixed (e.g., at a reference voltage or a ground level). In some embodiments, transistors M312 and M313 may not have a large impact on the noise performance of the circuit. Further, NMOS transistor M321 is a simple NMOS capacitor used to suppress any AC content on DC bias line N_Bias.

Capacitors C301 and C302 may be AC coupling capacitors, located between the first and second stages (e.g., at the first stage output/second stage input nodes Vin2P[Vo1P] and Vin2N[Vo1N] in FIG. 1). AC coupling may be used to prevent the buildup of DC offsets from one stage to the next that can be detrimental to the overall circuit. Capacitors C301 and C302 may be sized large enough such that there is not a large amount of signal lost due to capacitive voltage dividing between the AC coupling capacitors and/or the gate to source capacitors of inputs in the next stage. At the same time, making the AC coupling capacitors excessively large may degrade the bandwidth of the stage due to the parasitic bottom plates of the capacitors. In one embodiment, polysilicon capacitors (e.g., PIP capacitors) may be used instead of MOS capacitors due to the nonlinearity of the MOS capacitors.

Pull-down NMOS transistors M314, M315, M316, and M317 can bias the input of the second stage at ground. The sizing of these devices can determine the pole location of the high pass filter between the first and second stages. This high pass filter can be viewed as a series capacitor (AC coupling) with a shunt resistance to ground (pull-down transistors).

In addition, NMOS transistors M308 and M309 may provide the LNA with control for varying the gain/attenuation of the stage. Devices M308 and M309 can effectively short out the input pair, thereby decreasing the associated transconductance, and decreasing the gain of the circuit. Accordingly, the sizing of these devices can determine a steepness of the gain/attenuation curve. Generally, these devices may be made relatively small to allow for accurate control of the gain of the circuit.

The topology and operation of the second and third stages is largely the same or similar to the first stage. This second stage may be biased with a current of about 2 µA, where the current may only need to be large enough to allow the second stage to drive the third stage with sufficient bandwidth. Furthermore, additional low current stages can be placed after the second stage as long as each preceding stage drives the additional (or following) stage with sufficient bandwidth. In the example of FIG. 4, the third/last stage may be biased with a current of about 4 µA, where this current may provide sufficient drive to the load (e.g., a mixer) of the third stage with sufficient bandwidth.

Figure 5:
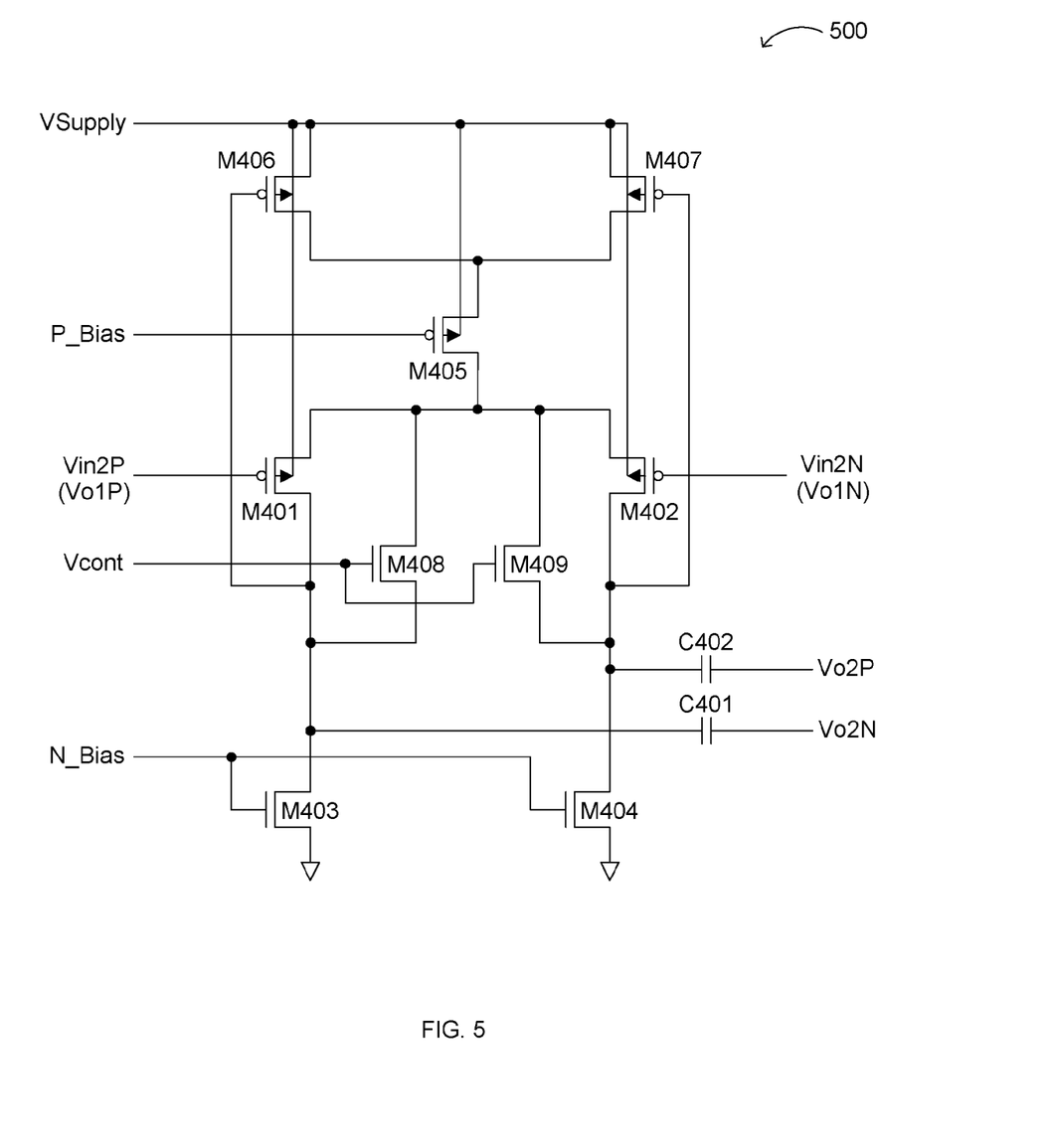
FIG. 5 is an exemplary schematic diagram showing exemplary second stage circuitry for an LNA in accordance with embodiments of the present invention.

FIG. 5 shows an exemplary schematic diagram of second stage circuitry 500 for an amplifier (e.g., LNA 100 in FIG. 1) in accordance with embodiments of the present invention. The input differential pair is formed by PMOS transistors M401 and M402. PMOS transistors M406 and M407 provide the common mode feedback to set the DC levels of the output (e.g., the gates of M406 and M407) of the second stage. For correct operation, transistors M406 and M407 may be biased in the triode region. Thus, the current being pushed into the second stage by transistor M405 can match the sum of the current source loads of NMOS transistors M403 and M404.

The common mode voltage of the gates of transistors M406 and M407 may be at the common mode reference voltage setup by N_Bias via transistors M403 and M404. Transistors M406 and M407 may act as two resistors in parallel to sense the common mode voltage of the output. When a differential signal is present, one resistance goes up and the other goes down, thus maintaining an approximately constant resistance to degenerate or provide a voltage drop at the source of device M405 to balance the current source loads (e.g., M403 and M404). Thus, matched current through M403 and M404 can balance the current through M406 and M407. Capacitors C401 and C402 may be AC coupling capacitors used between the second and third stages. In addition, NMOS transistors M408 and M409 may allow control of the gain/attenuation of the second stage of the LNA.

Figure 6:
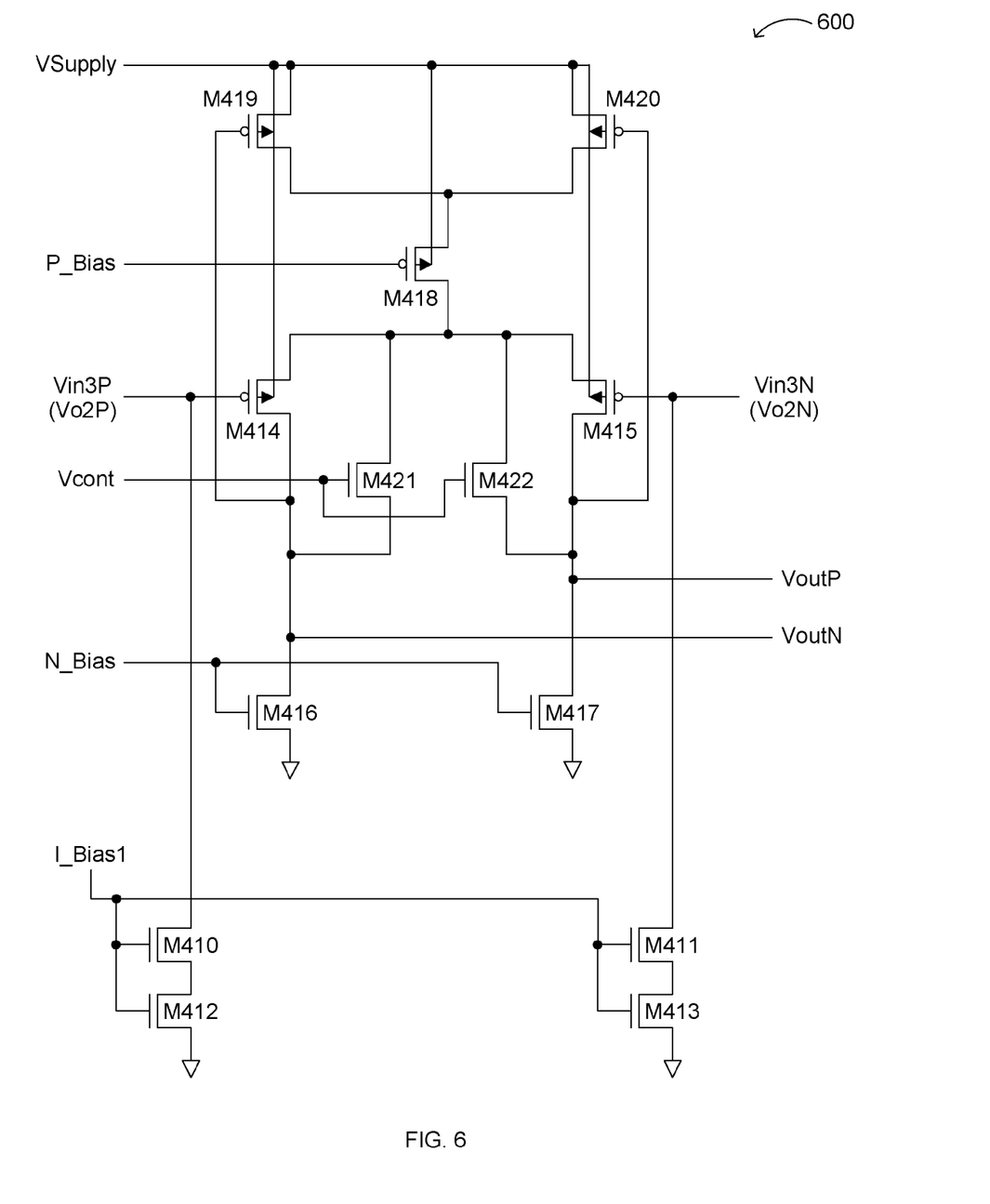
FIG. 6 is an exemplary schematic diagram showing exemplary third stage circuitry for an LNA in accordance with embodiments of the present invention.

FIG. 6 shows an exemplary schematic diagram for third stage circuitry 600 for an amplifier (e.g., LNA 100 in FIG. 1) in accordance with embodiments of the present invention. The input differential pair is formed by PMOS transistors M414 and M415. PMOS transistors M419 and M420, biased in the triode region, can provide the common mode feedback to set the DC levels of the output (e.g., VoutP/VoutN) of the third stage. The current being pushed into the third stage by transistor M418 can match the sum of the current source loads of NMOS transistors M416 and M417.

The common mode voltage of the gates of transistors M419 and M420 may be at the common mode reference voltage setup by N_Bias via transistors M416 and M417. Transistors M419 and M420 may act as two resistors in parallel to sense the common mode voltage of the output. When a differential signal is present, one resistance goes up and the other goes down, thus maintaining an approximately constant resistance to degenerate device M418 to balance the current source loads (e.g., M416 and M417). Pull-down NMOS transistors M410, M411, M412, and M413 can bias the input of the third stage at ground. In addition, NMOS transistors M421 and M422 may provide gain/attenuation control for the third LNA stage.

An Exemplary Method of Controlling an LNA Gain

An exemplary method of controlling a gain in an LNA, can include the steps of: (a) receiving a differential signal in an input stage, where the input stage can include (i) a first current source coupled to a differential input of the input stage, (ii) a first current load receiving a first bias voltage and coupling the input stage to a first power supply, and (iii) a first pair of common mode feedback transistors, coupled to an output of the first current load and configured to limit a current to the first current source, where the input stage provides an amplified signal; (b) receiving the amplified signal from the input stage in an additional stage, where the additional stage can include (i) a second current source coupled to a differential input of the additional stage, (ii) a second current load receiving the first bias voltage and coupling the additional stage to the first power supply, and (iii) a second pair of common mode feedback transistors, coupled to an output of the second current load and configured to limit a current to the second current source, where the additional stage provides an amplified output; (c) providing the first bias voltage to the first and second current loads; and (d) biasing the first and second current sources. Generally, the first power supply comprises a ground potential.

Figure 7:
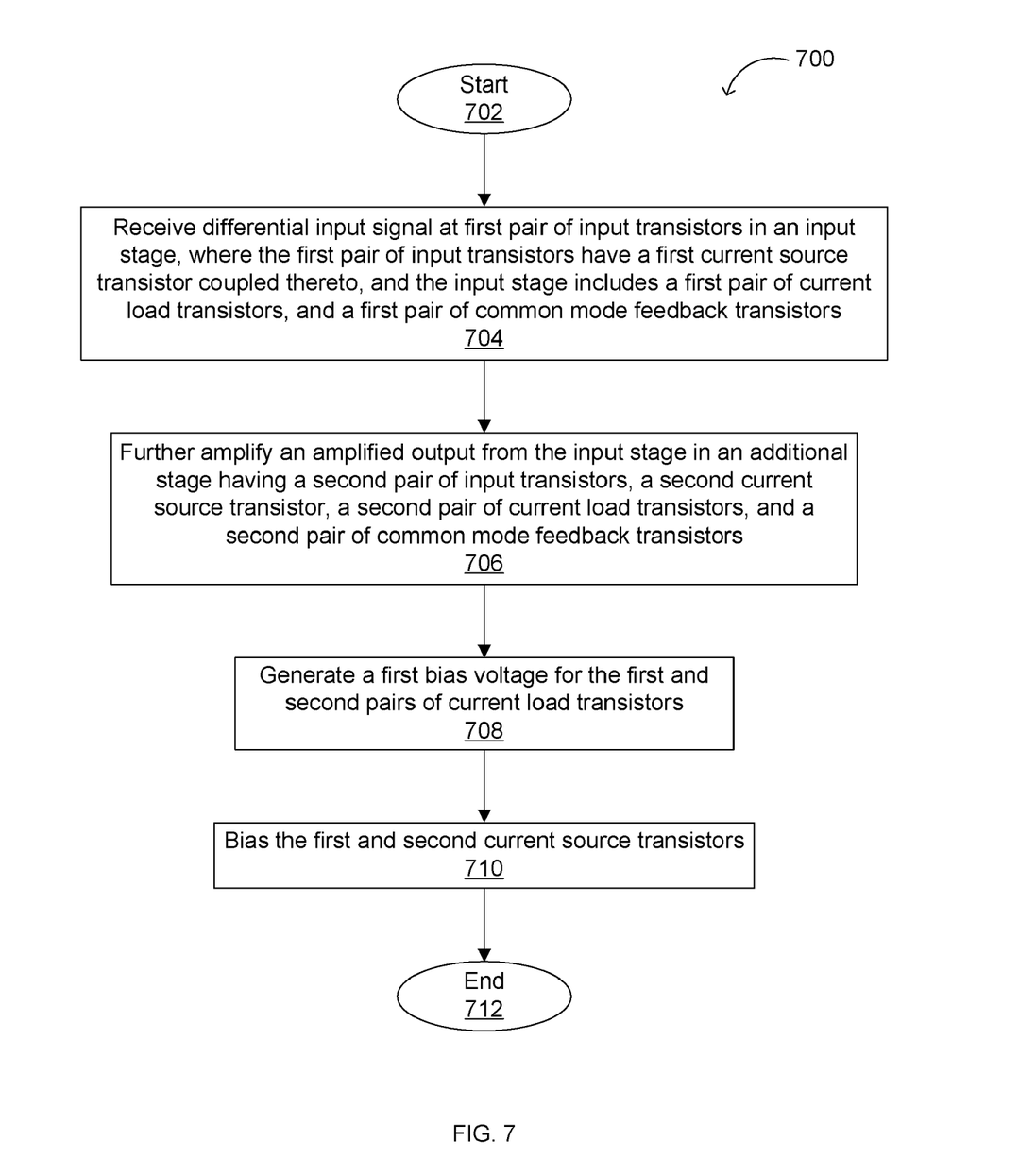
FIG. 7 is a flow diagram showing an exemplary method of gain control for an LNA in accordance with embodiments of the present invention.

FIG. 7 shows a flow diagram 700 for an exemplary method of gain control for an LNA in accordance with embodiments of the present invention. The flow can begin (702), and a differential input signal can be amplified using a differential input stage with common mode feedback transistors (704). The differential input signal can be further amplified using an additional stage, also having common mode feedback transistors (706). The differential input signal can then be further amplified using a third stage with common mode feedback transistors (708), and the flow can complete (710). Thus, in at least one embodiment, the method may further comprise amplifying the amplified output in a third stage. In addition, a regulated reference voltage (712), and a first bias voltage (714), can be supplied to each of the three stages of amplification. Similar to the second stage, the third stage may include (i) a third current source coupled to a differential input of the third stage, (ii) a third current load receiving the first bias voltage and coupling the third stage to the first power supply, and (iii) a third pair of common mode feedback transistors, coupled to an output of the third current load and configured to limit a current to the third current source, the third stage providing an output signal.

In various embodiments, the method may further comprise capacitively coupling the input stage (e.g., first stage 106 in FIG. 1) to the additional stage (e.g., second stage 108 in FIG. 1) and/or the additional stage to a further stage (e.g., third stage 110 in FIG. 1). Also, the first and second pairs of common mode feedback transistors may be configured to provide a regulated supply voltage to the input stage, the additional stage, and (when present) the third stage. Additionally or alternatively, the method may further comprise applying a second bias voltage to a first pair of gain control transistors in the input stage, where the first pair of gain control transistors are coupled to the first current source. When the amplifier comprises a third (differential) stage, the method may further comprise applying the second bias voltage to a second pair of gain control transistors in the additional stage, where the second pair of gain control transistors are coupled to the second current source. The method may also further comprise disabling the amplifier, and when the amplifier is disabled, discharging the first bias voltage.

While the above examples include MOS transistor implementations of LNA circuitry, one skilled in the art will recognize that other technologies may also be used in accordance with embodiments. Further, one skilled in the art will recognize that current-based differential signaling and/or control may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An amplifier, comprising:
   a) an input stage, including (i) a first differential input configured to receive a differential signal, (ii) a first current source coupled to said first differential input, (iii) a first current load receiving a first bias voltage and coupling said input stage to a first power supply, and (iv) a first pair of common mode feedback transistors, coupled to an output of said first current load and configured to limit a current to said first current source, said input stage providing an amplified signal;

b) an additional stage, including (i) a second differential input configured to receive said amplified signal from said input stage, (ii) a second current source coupled to said second differential input, (iii) a second current load receiving said first bias voltage and coupling said additional stage to said first power supply, and (iv) a second pair of common mode feedback transistors, coupled to an output of said second current load and configured to limit a current to said second current source, said additional stage providing an amplified output;

c) a first bias circuit configured to provide said first bias voltage to said first and second current loads; and d) one or more second bias circuits configured to bias said first and second current sources.

2. The amplifier of claim 1, wherein said amplified signal comprises an AC coupling capacitance between said input stage and said additional stage.

3. The amplifier of claim 1, wherein said input stage further comprises a first pair of gain control transistors coupled to said first differential input and said first current source, said first pair of gain control transistors receiving a second bias voltage.

4. The amplifier of claim 3, wherein said additional stage further comprises a second pair of gain control transistors coupled to said second differential input and said second current source, said second pair of gain control transistors receiving said second bias voltage.

5. The amplifier of claim 1, wherein said first and second pairs of common mode feedback transistors are coupled to a regulated supply voltage.

6. The amplifier of claim 1, further comprising an enable signal configured to discharge said first bias voltage when said amplifier is disabled.

7. The amplifier of claim 1, further comprising a third stage, including (i) a third differential input configured to receive said amplified output from said additional stage, (ii) a third current source coupled to said third differential input, (iii) a third current load receiving said first bias voltage and coupling said additional stage to said first power supply, and (iv) a third pair of common mode feedback transistors, coupled to an output of said third current load and configured to limit a current to said third current source, said third stage providing an output signal.

8. The amplifier of claim 1, wherein said first power supply comprises a ground potential.

9. The amplifier of claim 1, wherein said first bias circuit is configured to receive a bias current for generation of said first bias voltage.

10. The amplifier of claim 1, wherein said first and second differential inputs comprise first and second pairs of input transistors, respectively.

11. The amplifier of claim 10, wherein said first and second pairs of input transistors each comprise PMOS transistors.

12. The amplifier of claim 1, wherein said first and second current loads comprise first and second pairs of current load transistors, respectively.

13. The amplifier of claim 12, wherein said first and second pairs of current load transistors comprise NMOS transistors.

14. The amplifier of claim 1, wherein said first and second current sources comprise first and second current source transistors, respectively.

15. The amplifier of claim 14, wherein said first and second current source transistors comprise PMOS transistors.

16. The amplifier of claim 1, wherein said first and second pairs of common mode feedback transistors comprise PMOS transistors.

17. A method of controlling a gain in a low noise amplifier (LNA), comprising the steps of:

a) receiving a differential signal in an input stage, said input stage including (i) a first current source coupled to a differential input of said input stage, (ii) a first current load receiving a first bias voltage and coupling said input stage to a first power supply, and (iii) a first pair of common mode feedback transistors, coupled to an output of said first current load and configured to limit a current to said first current source, said input stage providing an amplified signal;

b) receiving said amplified signal from said input stage in an additional stage, said additional stage including (i) a second current source coupled to a differential input of said additional stage, (ii) a second current load receiving said first bias voltage and coupling said additional stage to said first power supply, and (iii) a second pair of common mode feedback transistors, coupled to an output of said second current load and configured to limit a current to said second current source, said additional stage providing an amplified output;

c) providing said first bias voltage to said first and second current loads; and d) biasing said first and second current sources.

18. The method of claim 17, further comprising capacitively coupling said input stage to said additional stage.

19. The method of claim 17, further comprising applying a second bias voltage to a first pair of gain control transistors in said input stage, wherein said first pair of gain control transistors are coupled to said first current source.

20. The method of claim 19, further comprising applying said second bias voltage to a second pair of gain control transistors in said additional stage, wherein said second pair of gain control transistors are coupled to said second current source.

21. The method of claim 17, wherein said first and second pairs of common mode feedback transistors are configured to provide a regulated supply voltage to said input stage and said additional stage.

22. The method of claim 17, further comprising disabling said amplifier and discharging said first bias voltage when said amplifier is disabled.

23. The method of claim 17, further comprising amplifying said amplified output in a third stage, said third stage including (i) a third current source coupled to a differential input of said third stage, (ii) a third current load receiving said first bias voltage and coupling the third stage to said first power supply, and (iii) a third pair of common mode feedback transistors, coupled to an output of said third current load and configured to limit a current to said third current source, said third stage providing an output signal.

24. The method of claim 17, wherein said first power supply comprises a ground potential.

* * * * *